(12) United States Patent
Kwak et al.

(10) Patent No.: US 7,944,140 B2
(45) Date of Patent: May 17, 2011

(54) ORGANIC LIGHT EMITTING DISPLAY AND METHOD OF MANUFACTURING THE SAME

(75) Inventors: Won-kyu Kwak, Suwon (KR); Hae-jin Chun, Suwon (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 331 days.

(21) Appl. No.: 12/107,159

(22) Filed: Apr. 22, 2008

(65) Prior Publication Data
US 2009/0026932 A1    Jan. 29, 2009

(30) Foreign Application Priority Data
Jul. 23, 2007    (KR) .................. 10-2007-0073385

(51) Int. Cl.
*H01J 1/62* (2006.01)
(52) U.S. Cl. ........................ 313/504; 313/506
(58) Field of Classification Search .......... 313/504, 313/506
See application file for complete search history.

(56) References Cited

U.S. PATENT DOCUMENTS
6,462,469 B1 * 10/2002 Young ........................ 313/504
2005/0087769 A1    4/2005 Yamazaki et al.

FOREIGN PATENT DOCUMENTS
| JP | 2003-503749 A | 1/2003 |
|---|---|---|
| JP | 2003-86356 | 3/2003 |
| JP | 2006-32156 | 2/2006 |
| JP | 2007-157470 | 6/2007 |
| KR | 2003-0010136 | 2/2003 |

OTHER PUBLICATIONS

Japanese Office action dated Oct. 9, 2009, for corresponding Chinese application 200810096573.3, with English translation noting listed references in this IDS.
Patent Abstracts of Japan, Publication No. 2006-032156; Date of Publication: Feb. 2, 2006; in the name of Koji Oda,et al.
Korean Patent Abstracts, Publication No. 1020030010136 A; Date of Publication: Feb. 5, 2003; in the name of Jae Yong Park.
Japanese Office action dated Oct. 5, 2010 for corresponding Japanese Patent Application No. 2007-267078.

* cited by examiner

*Primary Examiner* — Vip Patel
(74) *Attorney, Agent, or Firm* — Christie, Parker & Hale, LLP

(57) ABSTRACT

An organic light emitting display and a method of manufacturing the same. The light emitting display includes a substrate having a pixel region and a non-pixel region; an organic light emitting diode (OLED) in the pixel region and including a first electrode, an organic thin layer, and a second electrode; a driving circuit unit in the non-pixel region and for driving the OLED; a shielding layer in the non-pixel region and on the driving circuit unit, the shielding layer being electrically coupled to a ground power source; and an insulating layer interposed between the driving circuit unit and the shielding layer. The shielding layer effectively protects the driving circuit unit in the non-pixel region form electrostatic discharge (ESD). Also, the light emitting display may include a guard ring at an edge portion of the non-pixel region and electrically coupled to the shielding layer to further protect the driving circuit from ESD.

10 Claims, 6 Drawing Sheets

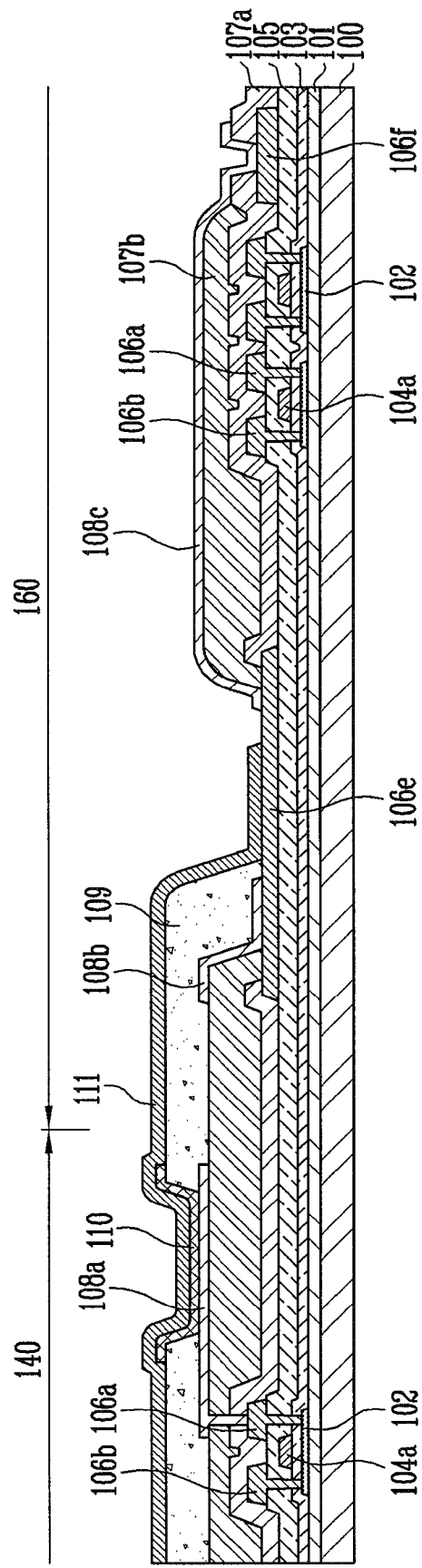
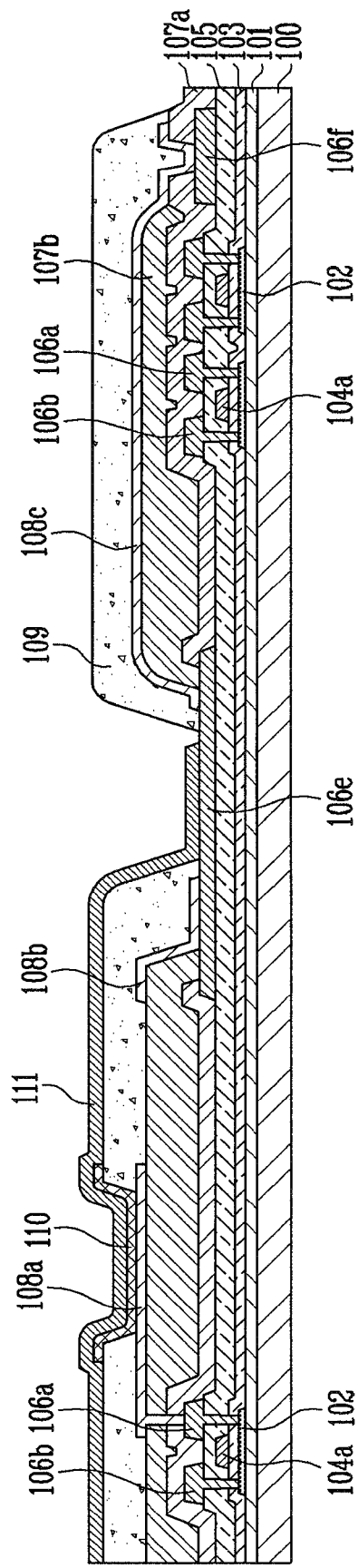

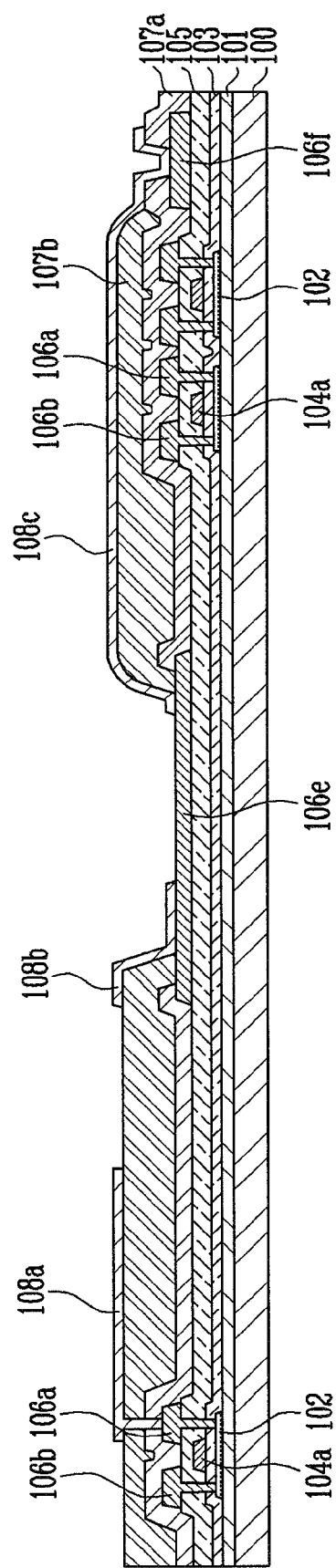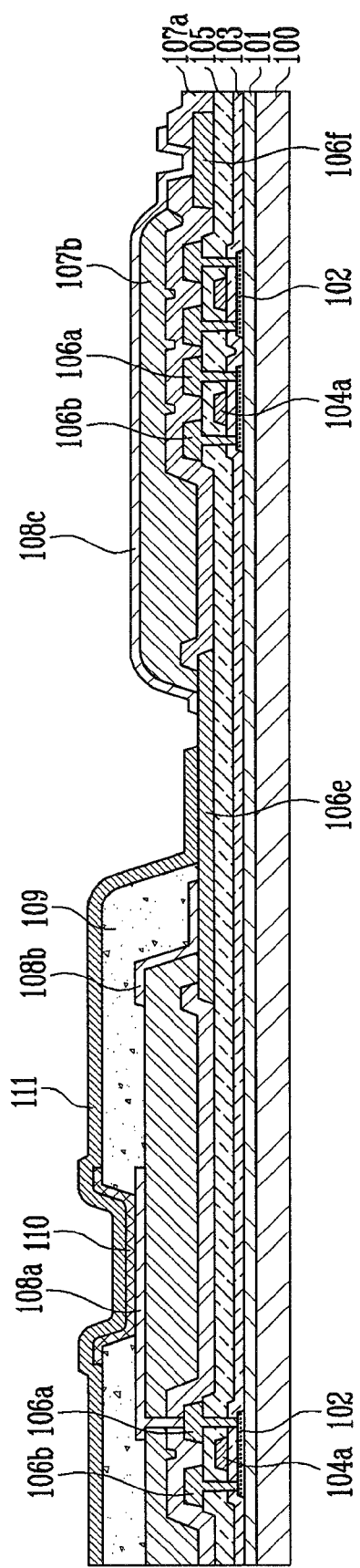

ORGANIC LIGHT EMITTING DISPLAY AND METHOD OF MANUFACTURING THE SAME

CROSS-REFERENCE TO RELATED APPLICATIONS

This application claims priority to and the benefit of Korean Patent Application No. 10-2007-0073385, filed on Jul. 23, 2007, in the Korean Intellectual Property Office, the entire content of which is incorporated herein by reference.

BACKGROUND

1. Field of the Invention

The present invention relates to an organic light emitting display and a method of manufacturing the same, and, more particularly to, an organic light emitting display capable of protecting a driving circuit from electrostatic discharge (ESD) and a method of manufacturing the same.

2. Description of the Related Art

An organic light emitting display is a self-emission display that has a wider view angle, a higher contrast, a faster response speed, and a lower power consumption as compared to that of a liquid crystal display (LCD). Because a back light is not required, the organic light emitting display can be made to be light and thin.

The organic light emitting display includes a first substrate having a pixel (or display) region and a non-pixel (or non-display) region and a container (or a second substrate) provided to face the first substrate for encapsulation and to be attached to the first substrate by a sealant such as epoxy.

In the pixel region, a plurality of organic light emitting diodes (OLEDs) are coupled between scan lines and data lines in a matrix to form pixels. Each OLED includes an anode electrode, a cathode electrode, and an organic thin layer formed between the anode electrode and the cathode electrode, wherein the organic thin layer includes a hole transport layer, an organic light emitting layer, and an electron transport layer.

In the non-pixel region, the scan lines and data lines are extended from the scan lines and the data lines of the pixel region, power source supply lines are disposed for operating the OLEDs, and a scan driver and a data driver are disposed for processing signals supplied from an external source through an input pad to supply the processed signals to the scan lines and the data lines. The scan driver and the data driver include a driving circuit for converting the signals supplied from the external source into scan signals and data signals to selectively drive the pixels. The scan driver and the data driver can be formed in a process of manufacturing the OLEDs or can be manufactured as an additional integrated circuit chip to be mounted on a substrate of the organic light emitting display. Since the substrate of the organic light emitting display is formed of glass, a large electrostatic discharge (ESD) can be generated during manufacturing or when the organic light emitting display is being used. In particular, because the driving circuit is composed of thin film transistors (TFTs) and are operated at high speed, a low voltage is formed in a peripheral part of the organic light emitting display, thereby causing the driving circuit to directly receive the ESD. When the ESD is received, the channels and the gate insulating layers of the TFTs may be damaged, erroneous operations may be generated by the short between the gate electrodes and wiring lines, and/or the driving circuit may be damaged due to the electric influence. The driving circuit is more severely damaged by the ESD as the driving circuit is highly integrated (or minimized).

In order to prevent (or protect) the driving circuit from being damaged by the ESD, an additional protecting element or a protecting circuit capable of discharging a high voltage may be added. However, the element or the protecting circuit is designed to discharge the ESD generated during the manufacturing processes and its effectiveness in preventing (or reducing) the damage generated during the use of the organic light emitting display is limited.

SUMMARY OF THE INVENTION

Aspects of the present invention are directed toward an organic light emitting display capable of protecting a driving circuit against electrostatic discharge (ESD) and a method of manufacturing the same.

Other aspects of the present invention are directed toward an organic light emitting display capable of preventing (or reducing) damage caused by the ESD without adding an additional protecting element (or an ESD protecting circuit) and a method of manufacturing the same.

An embodiment of the present invention provides an organic light emitting display including a substrate having a pixel region and a non-pixel region, an organic light emitting diode (OLED) formed in the pixel region to include a first electrode, an organic thin layer, and a second electrode, a driving circuit unit formed in the non-pixel region to drive the OLED, a shielding layer formed in the non-pixel region and on the driving circuit to be electrically coupled to a ground power source, and an insulating layer interposed between the driving circuit and the shielding layer.

Another embodiment of the present invention provides an organic light emitting display including a substrate having a pixel region and a non-pixel region; an organic light emitting diode (OLED) in the pixel region and including a first electrode, an organic thin layer, and a second electrode; a driving circuit unit in the non-pixel region and for driving the OLED; a shielding layer in the non-pixel region and on the driving circuit unit, the shielding layer being electrically coupled to a ground power source; and an insulating layer interposed between the driving circuit unit and the shielding layer. Here, the organic light emitting display may further include a guard ring formed at an edge portion of the non-pixel region to be electrically coupled to the shielding layer.

Another embodiment of the present invention provides a method of manufacturing an organic light emitting display. The method includes providing a substrate having a pixel region and a non-pixel region; forming a first thin film transistor (TFT) comprising a gate electrode and source and drain electrodes on the substrate in the pixel region and a second TFT on the substrate in the non-pixel region; forming an insulating layer in the pixel region and the non-pixel region and on the first TFT and the second TFT; forming a via hole in the insulating layer to expose the source or drain electrode of first TFT in the pixel region; forming a first electrode coupled to the source or drain electrode through the via hole in the pixel region; forming a shielding layer in the non-pixel region; forming a pixel defining layer in the pixel region; forming an opening in the pixel defining layer so that a part of the first electrode is exposed; forming an organic thin layer on the first electrode in the opening; and forming a second electrode in the pixel region.

BRIEF DESCRIPTION OF THE DRAWINGS

The accompanying drawings, together with the specification, illustrate exemplary embodiments of the present inven

FIG. 4 is a sectional view schematically illustrating an organic light emitting display according to a first embodiment of the present invention;

FIG. 5 is a sectional view schematically illustrating an organic light emitting display according to a second embodiment of the present invention;

FIGS. 7A, 7B, 7C, and 7D are sectional views schematically illustrating a method of manufacturing an organic light emitting display according to an embodiment of the present invention.

DETAILED DESCRIPTION OF EXEMPLARY EMBODIMENTS

Figure 1:
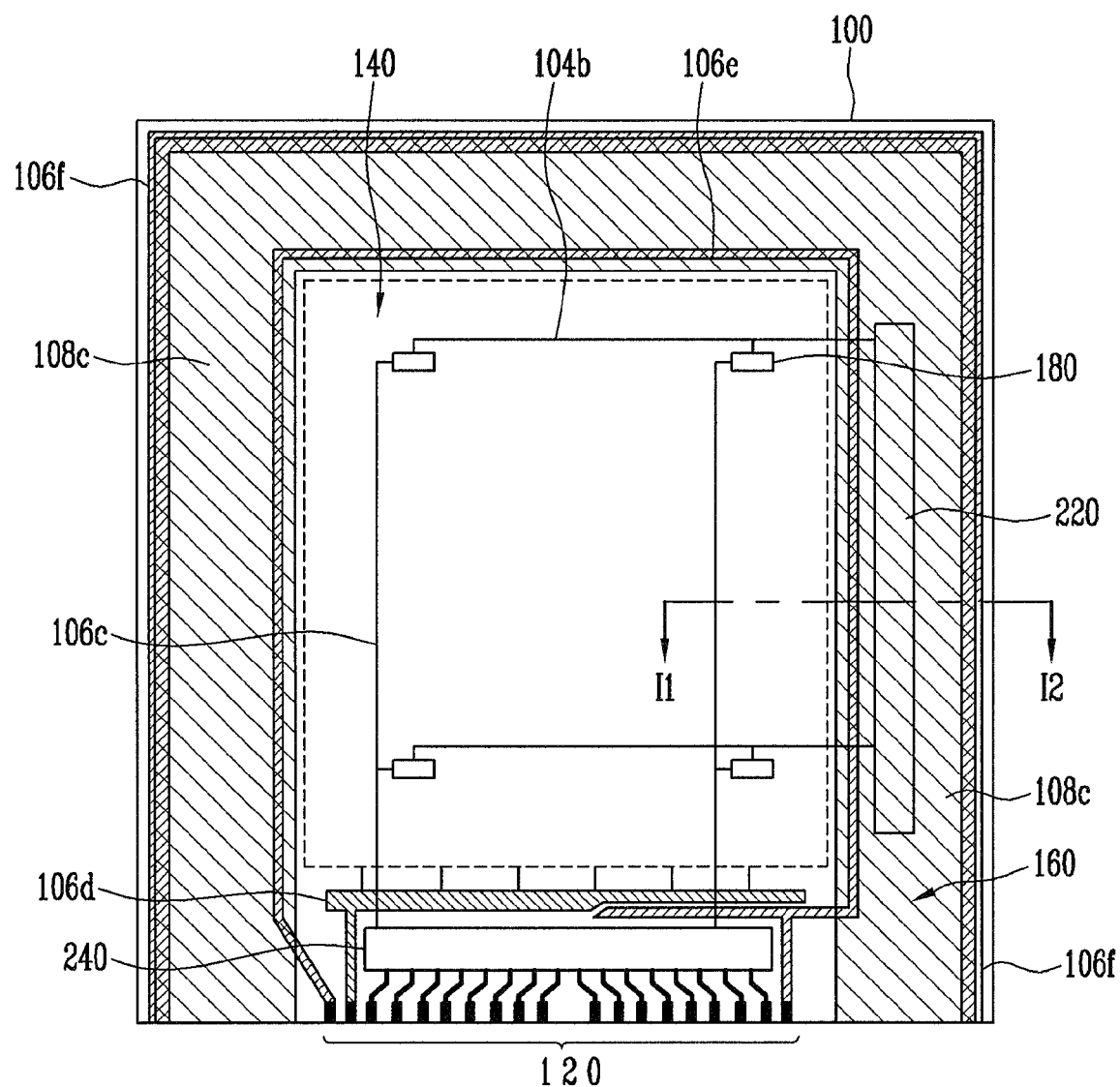
- FIG. 1 is a plan view schematically illustrating an organic light emitting display according to an embodiment of the present invention.

In the following detailed description, only certain exemplary embodiments of the present invention are shown and described, by way of illustration. As those skilled in the art would recognize, the invention may be embodied in many different forms and should not be construed as being limited to the embodiments set forth herein. Also, when a first element is referred to as being "on" a second element, it can be directly on the second element or be indirectly on the second element with one or more intervening elements interposed therebetween. In addition, when a first element is described as being "coupled to" a second element, the first element may be not only directly coupled to the second element but may also be indirectly coupled to the second element via one or more intervening elements. Further, elements that are not essential to the complete understanding of the invention may be omitted for clarity. Like reference numerals designate like elements throughout the specification.

FIG. 1 is a plan view schematically illustrating an organic light emitting display according to an embodiment of the present invention.

Figure 2:
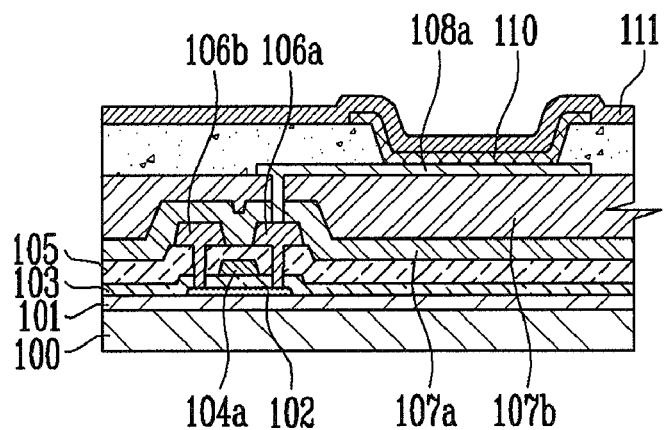
FIG. 2 is a sectional view schematically illustrating the organic light emitting diode (OLED) illustrated in FIG. 1.

As shown in FIG. 1, a substrate 100 includes a pixel region 140 and a non-pixel region 160. The non-pixel region 160 can be the region surrounding the pixel region 140 and/or the remaining region excluding the pixel region 140. In the pixel region 140, a plurality of organic light emitting diodes (OLEDs) 180 are coupled between scan lines 104b and data lines 106c in a matrix on the substrate 100. Referring to FIG. 2, Each OLED 180 includes an anode electrode 108a, a cathode electrode 111, and an organic thin layer 110 formed between the anode electrode 108a and the cathode electrode 111. The organic thin layer 110 includes a structure in which a hole transport layer, an organic light emitting layer, and an electron transport layer are laminated with each other, and a hole injection layer and an electron injection layer may also be included.

In a passive matrix type, the OLEDs 180 having the above structure are coupled between the scan lines 104b and the data lines 106c in a matrix.

In an active matrix type, the OLEDs 180 are coupled between the scan lines 104b and the data lines 106c in the matrix. Here, the TFTs for controlling the operations of the OLEDs 180 and capacitors for maintaining signals are further included. Each TFT includes a source, a drain, and a gate. In FIG. 2, a semiconductor layer 102 provides source and drain regions and a channel region. Source and drain electrodes 106a and 106b are coupled to the source and drain regions, and a gate electrode 104a insulated from the semiconductor layer 102 by a gate insulating layer 103 is formed on the channel region.

In the non-pixel region 160 shown in FIG. 1, the scan lines 104b and the data lines 106c are extended from the scan lines 104b and the data lines 106c of the pixel region 140, power source supply lines 106d and 106e are disposed for operating the OLEDs 180, and a scan driver 220 and a data driver 240 are disposed for processing signals supplied from an external source through a pad 120 to supply the processed signals to the scan lines 104b and the data lines 106c are formed on the substrate 100.

The scan driver 220 and the data driver 240 include a driving circuit for converting signals supplied from the external source through the pad 120 into scan signals and data signals to selectively drive the pixels. The scan driver 220 and the data driver 240 can be formed in a process of manufacturing the OLEDs or can be manufactured as an additional integrated circuit chip to be mounted on the substrate 100. In FIG. 1, only the scan driver 220 and the data driver 240 are illustrated. However, a driving circuit unit such as an emission driver and a DC demultiplexer can be further included in accordance with a driving type, or the structure of a circuit and the positions of the scan driver 220 and the data driver 240 can be changed.

In addition, a guard ring 106f is formed at the edge (or edge portion) of the substrate 100 (and in the non-pixel region 160) to surround the driving circuit (or the driving circuit unit). A shielding layer 108c is formed in the non-pixel region 160 and on the driving circuit, and is insulated from the driving circuit by an insulating layer. Here, the shielding layer 108c can be coupled to a ground power source (for example, ELVSS) through the power source supply line 106d or 106e.

Figure 3A:
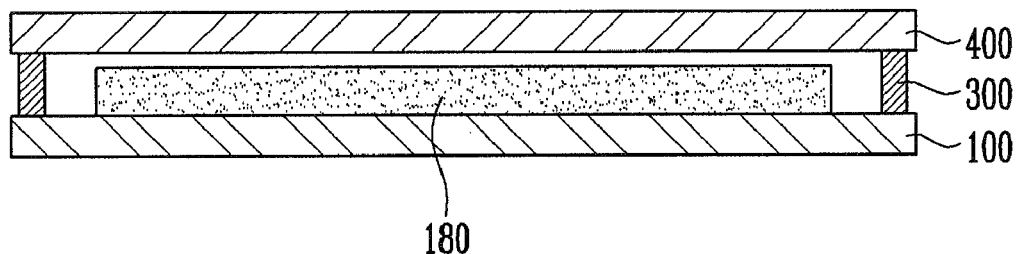
FIGS. 3A and 3B are sectional views schematically illustrating organic light emitting displays according to embodiments of the present invention.
Figure 3B:
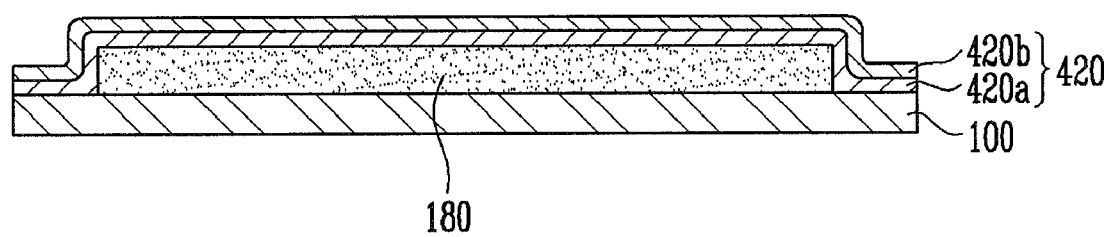

Referring to FIG. 3A, in one embodiment, a sealing substrate 400 is provided on the substrate 100 (where the OLEDs 180 are formed to face the sealing substrate 400), and the pixel region 140 is sealed up by a sealing material 300 interposed between the substrate 100 and the sealing substrate 400. Referring to FIG. 3B, in another embodiment, a sealing layer 420 having a multilayer structure of an organic layer 420a and an inorganic layer 420b is formed on the substrate 100.

A film-shaped flexible printed circuit (FPC) is electrically coupled to the pad 120 of the organic light emitting display having the above structure, and signals, such as power source voltages ELVDD and ELVSS and data, are input from the external source through the FPC. When the signals are input through the pad 120 to the power source supply lines 106d and 106e, the scan driver 220, and the data driver 240, the scan driver 220 and the data driver 240 supply scan signals and data signals to the scan lines 104b and the data lines 106c. Therefore, the OLEDs 180 of the pixels selected by the scan signals emit light components corresponding to the data signals. In the organic light emitting display according to an embodiment of the present invention, the non-pixel region 160 in which the driving circuit unit such as the scan driver 220, the data driver 240, the emission driver, and the DC demultiplexer formed of the TFTs is covered with the shielding layer 108c. Since the shielding layer 108c is coupled to the ground power source through the power source supply line 106d or 106e, it is possible to effectively protect the driving circuit unit against the ESD received through the peripheral part.

FIG. 4 is a sectional view schematically illustrating an organic light emitting display according to a first embodiment of the present invention and is a sectional view taken along the I1-I2 of FIG. 1.

A buffer layer 101 is formed on the substrate 100 in both the pixel region 140 and the non-pixel region 160. A semiconductor layer 102 that provides an active layer is formed on the buffer layer 101. The semiconductor layer 102 formed in the pixel region 140 provides the active layer of a TFT for driving the OLED 180, and the semiconductor layer 102 formed in the non-pixel region 160 provides the active layer of a TFT that constitutes the driving circuit unit.

The gate insulating layer 103 is formed in the pixel region 140 and the non-pixel region 160 and on the semiconductor layer 102, and the gate electrode 104a is formed on the gate insulating layer 103 on the semiconductor layer 102. Here, the scan line 104b coupled to the gate electrode 104a is formed in the pixel region 140, and the scan line 104b (extended from the scan line 104b of the pixel region 140) and the pad 120 for receiving signals from the external source are formed in the non-pixel region 160.

An interlayer insulating layer 105 is formed in the pixel region 140 and on the gate electrode 104a, and is also formed in the non-pixel region 160. Contact holes are formed in the interlayer insulating layer 105 and the gate insulating layer 103 to expose parts (or predetermined parts) of the semiconductor layer 102. The source and drain electrodes 106 and 106b are formed to be coupled to the semiconductor layer 102 through the contact holes. Here, the data line 106c coupled to the source and drain electrodes 106a and 106b is formed in the pixel region 140. The data line 106c extended from the data line 106c of the pixel region 140, the power source supply lines 106d and 106e, the guard ring 106f, and the pad 120 for receiving signals from the outside are all formed in the non-pixel region 160.

A protecting layer 107a and a planarizing layer 107b are formed in the pixel region 140 and the non-pixel region 160. A via hole is formed in the planarizing layer 107b and the protecting layer 107a of the pixel region 140 to expose a part (or a predetermined part) of the source or drain electrode 106a or 106b. Also, via holes are formed in the planarizing layer 107b and the protecting layer 107a of the non-pixel region 160 so that a part (or a predetermined part) of the power source supply line 106d or 106e and a part (or a predetermined part) of the guard ring 106f are exposed. Then, the anode electrode 108a coupled to the source or drain electrode 106a or 106b through via hole in the pixel region 140 is formed in the pixel region 140, and the shielding layer 108c is formed in the non-pixel region 160. Here, the shielding layer 108c is formed in the non-pixel region 160 and on the driving circuit unit to be coupled to the power source supply line 106d or 106e and the guard ring 106f through the via holes in the non-pixel region 160. In FIG. 4, a pattern 108b coupled to the power source supply line 106e increases the surface area of the power source supply line 106e so that electric resistance is reduced and can be formed together with the anode electrode 108a.

A pixel defining layer 109 is formed in the pixel region 140, and an opening is formed in the pixel defining layer 109 to expose a partial region (emission region) of the anode electrode 108a. The organic thin layer 110 is formed on the exposed anode electrode 109a, and the cathode electrode 111 is formed in the pixel region 140 and on the organic thin layer 110 to be coupled to the power source supply line 106d or 106e.

FIG. 5 is a sectional view schematically illustrating an organic light emitting display according to a second embodiment of the present invention and is a sectional view taken along the line I1-I2 of FIG. 1.

The organic light emitting display according to the second embodiment of the present invention has substantially the same structure as the organic light emitting display according to the first embodiment. However, the light shielding layer 108c of the non-pixel region 160 is covered with a protecting layer 109 formed of an organic layer.

As described in the first embodiment, when the shielding layer 108c is formed on the planarizing layer 107b formed of acryl, the attachment state between the planarizing layer 107b and the shielding layer 108c may deteriorate due to the weak layer structure of acryl. Therefore, the shielding layer 108c is covered with the protecting layer 109 so that the attachment state between the planarizing layer 107b and the shielding layer 108c can be maintained so that the shielding layer 108c can be protected.

Therefore, according to the first embodiment, the pixel defining layer 109 is formed only in the pixel region 140. However, according to the second embodiment, the pixel defining layer 109 is formed on the pixel region 140 and the non-pixel region 160 as the protecting layer 109. In addition, an opening is formed in the pixel defining layer 109 of the pixel region 140 to expose a partial region (emission region) of the anode electrode 108a, and an opening is formed in the pixel defining layer 109 of the non-pixel region 160 to expose a part (or a predetermined part) of the power source supply line 106d or 106e. The organic thin layer 110 is formed on the exposed anode electrode 109a, and the cathode electrode 111 coupled to the power source supply line 106d or 106e through the opening is formed in the pixel region 140 and on the organic thin layer 110.

Figure 6:
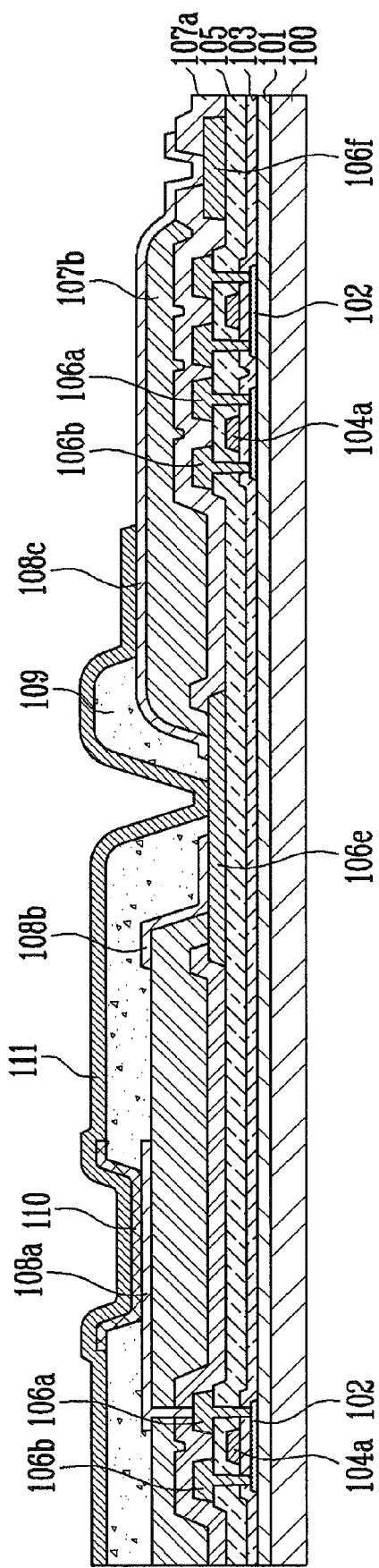
FIG. 6 is a sectional view schematically illustrating an organic light emitting display according to a third embodiment of the present invention.

FIG. 6 is a sectional view schematically illustrating an organic light emitting display according to a third embodiment of the present invention and is taken along the line I1-I2 of FIG. 1.

The organic light emitting display according to the third embodiment of the present invention has substantially the same structure as the structure of the organic light emitting display according to the first embodiment. However, the cathode electrode 111 is extended to the top of the shielding layer 108c (or is extended to be on the shielding layer 108c). Here, the pixel defining layer 109 can reside between the cathode electrode 111 and the shielding layer 108c in the remaining part excluding the contacting part between the cathode electrode 111 and the shielding layer 108c.

The cathode electrode 111 is extended to the top of the shielding layer 108c (or is extended to be on the shielding layer 108c) to form an electric contact in the overlapping part between the cathode electrode 111 and the shielding layer 108c to reduce the size of the contacting part (opening) between the cathode electrode 111 and the power source supply line 106d or 106e. As a result, a dead space of the substrate 100 can be effectively reduced.

A method of manufacturing an organic light emitting display according to an embodiment of the present invention having the above structure will be described in more detail with reference to FIGS. 7A to 7D.

Figure 7A:
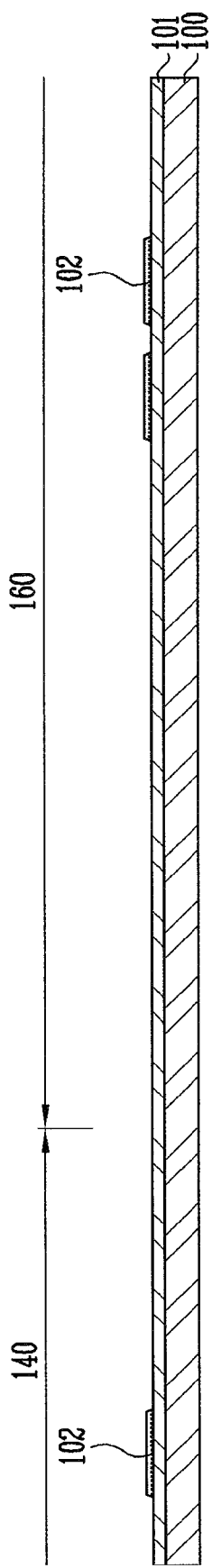
Figure 7B:
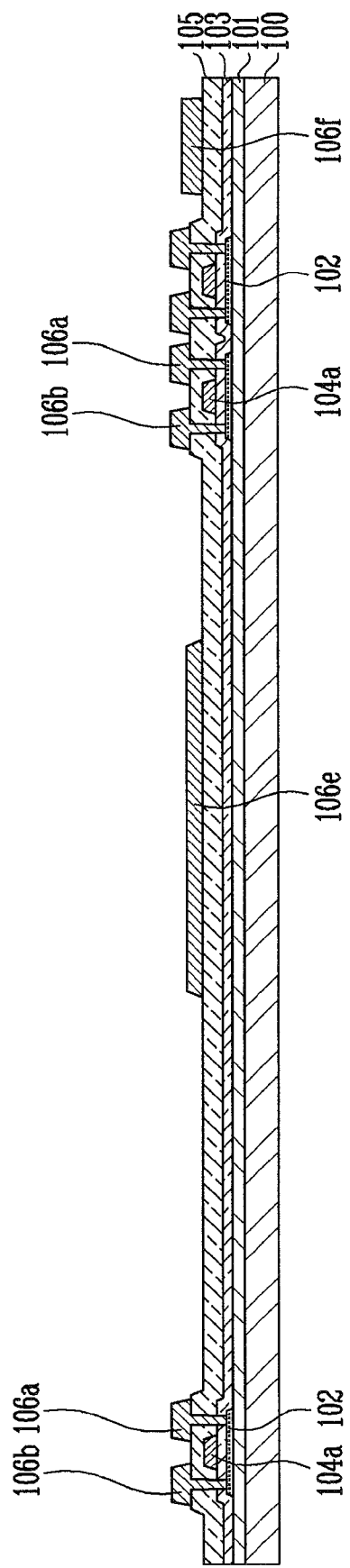

Referring to FIG. 7A, first, the substrate 100 in which the pixel region 140 and the non-pixel region 160 are defined is provided. The buffer layer 101 is formed on the substrate 100 in both the pixel region 140 and the non-pixel region 160 of SiO$_2$ and SiNx, and the semiconductor layer 102 is formed on the buffer layer 101. The semiconductor layer 102 is an active layer for providing the source and drain regions and the channel region of the TFT. The semiconductor layer 102 formed on the pixel region 140 provides the active layer of the TFT for driving the OLED 180, and the semiconductor layer 102 formed in the non-pixel region 160 provides the active layer of the TFT that constitutes the driving circuit (or the driving circuit unit). Therefore, the number of semiconductor layers 102 formed in the pixel region 140 and the non-pixel region 160 corresponds to the number of TFTs required for constituting the pixel circuit and the driving circuit. Referring to FIG. 7B, the gate insulating layer 103 is formed in the pixel region 140 and the non-pixel region 160 and on the semiconductor layer 102, and the gate electrode 104*a* is formed on the gate insulating layer 103 on the semiconductor layer 102. Here, the scan line 104*b* coupled to the gate electrode 104*a* is formed in the pixel region 140, and the scan line 104*b* extended from the scan line 104*b* of the pixel region 140 and the pad for receiving signals from the outside are formed in the non-pixel region 160. The gate electrode 104*a*, the scan line 104*b*, and the pad 120 are formed of metals (such as Mo, W, Ti, and Al), an alloy of the above metals, or a laminated structure (e.g., a laminated structure of the above metals).

The interlayer insulating layer 105 is formed in the pixel region 140 and the non-pixel region 160 and on the gate electrode 104*a*. The interlayer insulating layer 105 and the gate insulating layer 103 are patterned to form the contact holes so that parts (or predetermined parts) of the semiconductor layer 102 are exposed and the source and drain electrodes 106*a* and 106*b* are formed to be coupled to the semiconductor layer 102 through the contact holes. Here, in the pixel region 140, the data line 106*c* coupled to the source and drain electrodes 106*a* and 106*b* is formed. Also, in the non-pixel region 160, the data line 106*c* extended from the data line 106*c* of the pixel region 140, the power source supply lines 106*d* and 106*e*, the guard ring 106*f*, and the pad 120 for receiving the signals from the external source are formed. The source and drain electrodes 106*a* and 106*b*, the data line 106*c*, the power source supply lines 106*d* and 106*e*, the guard ring 106*f*, and the pad 120 are formed of the metals (such as Mo, W, Ti, and Al), an alloy of the above metals, or a laminated structure (e.g., a laminated structure of the above metals).

Referring to FIG. 7C, after the protecting layer 107*a* is formed in the pixel region 140 and the non-pixel region 160 of SiN, the planarizing layer 107*b* is formed on the protecting layer 107*a* of acryl to planarize the surface. The planarizing layer 107*b* and the protecting layer 107*a* are patterned to form a via hole in the pixel region 140 to expose a part (or a predetermined part) of the source or drain electrode 106*a* or 106*b*. Also, the planarizing layer 107*b* and the protecting layer 107*a* are patterned to form via holes in the non-pixel region 160 so that a part (or a predetermined part) of the power source supply line 106*d* or 106*e* and a part (or a predetermined part) of the guard ring 106*f* are exposed.

According to the present embodiment, the protecting layer 107*a* and the planarizing layer 107*b* are sequentially formed, and then the planarizing layer 107*b* and the protecting layer 107*a* are patterned. However, the present invention is not thereby limited. That is, for example, after the protecting layer 107*a* is formed and patterned, the planarizing layer 107*b* can then be formed and patterned.

Then, the anode electrode 108*a* coupled to the source or drain electrode 106*a* or 106*b* through the via hole in the pixel region 140 is formed in the pixel region 140, and the shielding layer 108*c* is formed in the non-pixel region 160. The shielding layer 108*c* is formed in the non-pixel region 160 and on the driving circuit unit to be coupled to the power source supply line 106*d* or 106*e* and the guard ring 106*f* through the via holes in the non-pixel region 160.

Here, the peripheral circuit unit and the shielding layer 108*c* are electrically insulated from each other by an insulating layer formed of the protecting layer 107*a* and the planarizing layer 107*b*. Here, in order to minimize (or reduce) parasitic capacitance between the peripheral circuit unit and the shielding layer 108*c*, the protecting layer 107*a* and the planarizing layer 107*b* are formed to be relatively thick.

In addition, according to the present embodiment, in order not to add additional process and mask, the shielding layer 108*c* is formed in a process of forming the anode electrode 108*a*. However, the present invention is not thereby limited, and the anode electrode 108*a* and the shielding layer 108*c* can be formed by the separate (or respective) processes. In one embodiment, when the anode electrode 108*a* and the shielding layer 108*c* are formed in the same process with a same anode electrode material, the anode electrode 108*a* and the shielding layer 108*c* are electrically separated from each other.

In the case of a front emission type, the anode electrode material can be formed of an opaque inorganic material or an alloy of inorganic materials. In the case of a rear emission method, the anode electrode material can be formed of a transparent inorganic material or an alloy of inorganic materials. The opaque inorganic material or the alloy of the inorganic materials can be ACX (an Al alloy), Ag, or Au. The transparent inorganic material or the alloy of the inorganic materials can be ITO, IZO, or ITZO.

Referring to FIG. 7D, the pixel defining layer 109 is formed in the pixel region 140, and the pixel defining layer 109 is patterned to have an opening so that a partial region (emission region) of the anode electrode 108*a* is exposed. Then, the organic thin layer 110 is formed on the anode electrode 109*a* exposed through the opening and the cathode electrode 111 is formed in the pixel region 140 and on the organic thin layer 110 to be coupled to the power source supply line 106*d* or 106*e* (refer to FIG. 4).

According to another embodiment, the pixel defining layer 109 is formed in both the pixel region 140 and the non-pixel region 160, and the pixel defining layer 109 is patterned to form an opening in the pixel region 140 so that a partial region (emission region) of the anode electrode 108*a* is exposed. In addition, the pixel defining layer 109 is also patterned to form an opening in the non-pixel region 160 so that a part (or a predetermined part) of the power source supply line 106*d* or 106*e* is exposed. Then, the organic thin layer 110 is formed on the anode electrode 108*a* exposed through the opening, and the cathode electrode 111 coupled to the power source supply line 106*d* or 106*e* through the opening is formed in the pixel region 140 and on the organic thin layer 110 (refer to FIG. 5).

According to another embodiment, in a process of forming the cathode electrode 111, the cathode electrode 111 is extended to the top of the shielding layer 108*c* (or is extended to be on the shielding layer 108*c*) and is electrically coupled to each other in the overlapping part of the cathode electrode 111 and the shielding layer 108*c* (refer to FIG. 6).

Referring to FIG. 3A, a sealing substrate 400 is provided on the substrate 100 (where the OLEDs 180 are formed to face the substrate 100), and the substrate 100 and the sealing substrate 400 are attached to each other by the sealing material 300 formed at the edge portions of the substrate 100 and the sealing substrate 400 to seal the pixel region 140. In another embodiment, referring to FIG. 3B, the sealing substrate 420 formed of a multilayer structure of the organic layer 420a and the inorganic layer 420b is formed on the substrate 100 to seal the pixel region 140.

As described above, in an embodiment of the present invention, the shielding layer coupled to the ground power source is formed in the non-pixel region and on the driving circuit so that the driving circuit is effectively protected against the ESD. According to the conventional organic light emitting display, the driving circuit is damaged by the ESD of 2 kV. However, according to the organic light emitting display of an embodiment of the present invention, the driving circuit can be protected against the ESD of about 15 kV.

In addition, according to an embodiment of the present invention, the shielding layer is formed in the process of forming the anode electrode so that it is possible to prevent (or protect) the organic light emitting display from being damaged without adding an additional masking process, an additional mask, an additional protecting element, and/or an additional ESD protecting circuit to thereby reduce manufacturing cost.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting display comprising:
    a substrate having a pixel region and a non-pixel region;
    an organic light emitting diode (OLED) in the pixel region and including a first electrode, an organic thin layer, and a second electrode;
    a driving circuit unit in the non-pixel region and for driving the OLED;
    a shielding layer in the non-pixel region and on the driving circuit unit, the shielding layer being electrically coupled to a ground power source; and
    an insulating layer interposed between the driving circuit unit and the shielding layer.

2. The organic light emitting display as claimed in claim 1, further comprising a guard ring at an edge portion of the non-pixel region and electrically coupled to the shielding layer.

3. The organic light emitting display as claimed in claim 1, further comprising a protecting layer on the shielding layer.

4. The organic light emitting display as claimed in claim 3, wherein the protecting layer comprises an organic material.

5. The organic light emitting display as claimed in claim 1, wherein the shielding layer and the first electrode both comprise a same electrode material.

6. The organic light emitting display as claimed in claim 1, further comprising a power source supply line, wherein the second electrode and the shielding layer are coupled to the ground power source through the power source supply line.

7. The organic light emitting display as claimed in claim 1, wherein the second electrode is extended to be on the shielding layer.

8. The organic light emitting display as claimed in claim 1, wherein the driving circuit unit comprises a scan driver and a data driver.

9. The organic light emitting display as claimed in claim 1, further comprising a sealing substrate on and attached to the substrate by a sealing material to seal the pixel region.

10. The organic light emitting display as claimed in claim 1, further comprising a sealing layer having a multilayer structure of an organic layer and an inorganic layer on the substrate to seal the pixel region.

* * * * *

UNITED STATES PATENT AND TRADEMARK OFFICE
CERTIFICATE OF CORRECTION

| | | |
|---|---|---|
| PATENT NO. | : 7,944,140 B2 | Page 1 of 1 |
| APPLICATION NO. | : 12/107159 | |
| DATED | : May 17, 2011 | |
| INVENTOR(S) | : Won-Kyu Kwak et al. | |

It is certified that error appears in the above-identified patent and that said Letters Patent is hereby corrected as shown below:

On the Title Page

Item (56) References Cited, Other Publications, line 8        Delete "Japenese" Insert -- Japanese --

Item (57) Abstract, line 12        Delete "form" Insert -- from --

Signed and Sealed this
Twentieth Day of March, 2012

David J. Kappos
*Director of the United States Patent and Trademark Office*